United States Patent [19]
Sabnis et al.

[11] Patent Number: 5,780,201
[45] Date of Patent: Jul. 14, 1998

[54] ULTRA THIN PHOTOLITHOGRAPHICALLY IMAGEABLE ORGANIC BLACK MATRIX COATING MATERIAL

[75] Inventors: Ram W. Sabnis; Jonathan W. Mayo; Edith G. Hays; Terry L. Brewer, all of Rolla; Michael D. Stroder, Springfield, all of Mo.; Akira Yanagimoto, Tokyo, Japan; Yasuhisa Sone, Chiba, Japan; Yoshitane Watanabe, Tokyo, Japan; Kiyomi Ema, Chiba, Japan

[73] Assignees: Brewer Science, Inc., Rolla, Mo.; Nissan Chemical Industries, Ltd., Chiyoda-ku, Japan

[21] Appl. No.: 721,841

[22] Filed: Sep. 27, 1996

[51] Int. Cl.$^6$ ............................................. G03F 7/004
[52] U.S. Cl. ........................................ 430/270.1; 430/7
[58] Field of Search .......................... 430/270.1, 283.1, 430/7; 349/110

[56] References Cited

U.S. PATENT DOCUMENTS

| | | |
|---|---|---|
| 4,822,718 | 4/1989 | Latham et al. ............... 430/271.1 |
| 5,527,649 | 6/1996 | Sato et al. ........................ 430/7 |
| 5,619,357 | 4/1997 | Angelopoulos et al. ........ 349/110 |

*Primary Examiner*—John A. McPherson
*Attorney, Agent, or Firm*—Veo Peoples, Jr.

[57] ABSTRACT

An organic black matrix having high resistivity ($\geq 10^{11}$ ohm/square), high optical density ($\geq 2.0$) at ultra thin film thicknesses ($\leq 1.0$ microns) for improved STN and TFT pixel display applications is made possible by combining polyimide/dye solutions and mixed metal oxide pigment dispersions at a weight/weight ratio of dye to pigment of 1:15 to 3:15. The need for low resistivity carbon black, as a replacement for sputtered chrome, is negated.

10 Claims, 6 Drawing Sheets

FIG. 1  Flow Chart of Manufacturing Process of BM

FIG. 2 TRANSMISSION OF 1 μm FILM

FIG. 3 LITHOGRAPHY DATA

FIG. 5 SCANNING ELECTRON MICROSCOPE DATA

FIG. 4 RESOLUTION PATTERN

FIG. 6 SURFACE ROUGHNESS MEASUREMENT

FIG. 7 THE SELF-ALIGNMENT PROCESS USED TO FORM THE BLACK MATRIX

ULTRA THIN PHOTOLITHOGRAPHICALLY IMAGEABLE ORGANIC BLACK MATRIX COATING MATERIAL

BACKGROUND OF INVENTION

1. Field of Invention

The present invention relates to organic black matrices for color filter plate manufacture and to methods for making the same. It particularly relates to nonconductive black matrices, having very high resistivity, and having high optical density at ultra thin film thicknesses.

2. Background of the Prior Art

Multicolor liquid crystal displays (LCDs) are routinely produced having a thin, light-absorbent film, called a black matrix, applied to an array of color pixels which together form a color filter plate. The processing of such color filter plates remains one of the most troublesome steps during mass production of the LCDs because they use sputtered chrome black matrices.

A spincoatable, organic polymer based black matrix would tend to be more environmentally friendly than chrome, easier to reproduce, and offer lithographic processing advantages. However, there are at least two types of color filter plates for LCDs where organic polymer black matrices are woefully expensive and/or lack the desired performance. That is, the unavailability of an organic black matrix photoresist having sufficiently high resistivity and sufficiently high optical density at ultra thin film thickness, has hampered the advancement of 1) thin film transistor (TFT)-arrays for TFT-LCDs and 2) super twisted nematic (STN) LCDs.

For purposes of illustration, FIGS. 7, 7(a), 7(b), and 7(c) show a somewhat oversimplified stepwise illustration of the coating and imaging of organic black matrix photoresists onto either TFT or STN color pixels for large area LCDs. The RGB (red, green, blue) color pixels 1 could be either TFTs or STNs. Such color filter plates have an Indium-tin-oxide (ITO) electrode layer or layers 2 and signal lines 3. All are normally applied to a glass substrate 4. The illustration shows the exposure of UV light through the glass substrate for purposes of lithographically imaging the organic black matrix 5.

In these TFT and STN applications, high resistivity (so as to be nonconductive) is mandatory in order to avoid electrical coupling between the ITO electrode layer and the signal lines. Otherwise, coupling with the signal lines (sometimes referred to as data lines) causes vertical crosstalk.

The optical density (O.D.) of the black matrix must be greater than 2.0 in order to block the transmission of light to the TFT or STN displays. Otherwise, photo leaks from non-display areas will reduce the contrast ratio and create adverse photo leakage current. In other words, one can enhance the contrast of the LCD by eliminating the light leakage which would otherwise occur through spaces patterned between the red, green, and blue (RGB) pixels on the color filter plate. The technical goal is to keep the light transmission at or below 1%, across the entire spectrum of from ultraviolet to infrared, at ultra thin black matrix film thicknesses.

It has proven extremely difficult, if not impossible, to manufacture a nonconductive organic black matrix having an O.D. greater than 2.0 at ultra thin black matrix film thicknesses. Although O.D. greater than, or equal to, 2.0 have been achieved for organic black matrices at a 2 micron polymer thickness, such layer thicknesses are at the threshold for a number of defects. For example, the so-called reverse tilt inside each pixel display area occurs at 2 microns. Reverse tilt causes after-image and contrast deterioration. Overcoming that drawback, inter alia, requires a nonconductive, organic black matrix film having O.D. greater than 2.0 at a thickness of 1.0 micron or less.

Despite the high cost-of-ownership, a complex manufacturing process (sputtering), and potential environmental problems, and despite a higher reflectance than desired, the most common black matrix material has continued to be sputtered chrome, rather than spin-coated organic polymers. Although vacuum evaporation and other coating techniques for metals such as nickel and aluminum and even chromium have been devised, sputtered chrome remains the most common technique and material because other techniques and other materials lack sufficiently high O.D. (>2.0) to provide enhanced contrast and high resolution, at sufficiently ultra thin thicknesses (1 micron or less) and at sufficiently high resistivity (at least $10^5$ ohm/square) to be commercially effective for STN and TFT application.

For example, Latham's U.S. Pat. No. 4.822.718 disclosed in 1989 potential black matrices of the organic type made from polyamic acid/dye combinations (as distinguished from pigment-dispersions). The resistivity of these light-absorbing layers was found to be as high as $3.0 \times 10^{15}$ ohm/square.

It has been disclosed by Hessler, et al., in the article "Pigment-Dispersed Organic Black-Matrix", *SID Digest*, 26:446, (1995), however, that Latham's mixtures of the red and blue dyes bound in polyimide composition as well as mixtures of red and blue pigments in pigment-dispersed organic black matrices disclosed by others did not come close to the desired O.D. (greater than 2.0), even when coated at film thicknesses greater than 3 microns. Changing the ratios of red to blue pigments, or adding low levels of violet, yellow or green pigments to the red and blue pigment mixtures did not improve overall O.D. performance of the formulations. Carbon black pigment, dispersed in acrylic polymer, did, however, achieve 0.01% light transmission for some samples. An average O.D. of 2.8 for a 1.5 micron, spin-coated film, over the whole spectrum of 400–700 nm, was made possible by a critical selection of dispersants. However, the resistivity was a disappointing 90K ohm/square.

As disclosed by Yamanaka in his article, "Integrated Black Matrix on TFT Arrays", *SID Digest*, 23:789 (1992), carbon black, even with an advanced acrylic photo polymer, does not achieve O.D. greater than 2.0, at thicknesses less than 2 microns without sacrificing resistivity and creating crosstalk. Yamanaka also describes the disadvantage of a 2 micron "step size" (or thickness). It is so large that it results in reverse tilt.

U.S. Pat. No. 5,368,976, by Tajima, et al., discloses another example of pigment-dispersed color filter compositions. An alkali-soluble block copolymer is employed as a binder for a radiation-sensitive compound and pigments such as pigment Black 1 and pigment Black 7 but with unsuitably large particle sizes (filtered at 10 microns). Although it is well known that pigment Black 1 does not provide the requisite O.D. greater than 2.0 at practical thicknesses, pigment Black 7 (better known as simply "Carbon Black") does provide O.D. greater than 2.0 as shown by Hessler, et al. Yet, as Yamanaka explains, even at thicknesses less than 2.0 microns, the threat of crosstalk exists when the black matrix is too conductive for effective STN or TFT applications, and particle sizes of 10 micron diameter would lead to films having reverse tilt.

Suginoya, et al., in their article "Self-Alignment Fabrication of the ITO Electrode Pattern on an Electrodeposited Tricolor Filter in a Black Matrix: An Application to STN-LCDs", *Proc. of SID*, 32:201, (1991), identify another shortcoming of STN-LCDs having organic black matrices made from carbon black. That is, although the green filter of the display provides a good shutter which transmits less than 1% of incident light at 365, 405 and 435 nm, the red filter does not. It has transmittance of 4% at 365 nm and 6% at 405 nm. Also, the blue filter is even worse, having transmittance of 35% at 405 nm and of 55% at 435 nm. A separate approach was therefore necessary for light above 400 nm than for light below 400 nm. The black matrix average transmittance was substantially greater than 1.0% throughout the spectrum, when using this complicated approach (FIG. 13 of the reference). It was closer to 10%.

Accordingly, neither the past dye-based nor the past pigment-based organic black matrices could effectively provide O.D. greater than 2.0, at thicknesses less than 1 micron without disaffecting STN and TFT performance. Furthermore, although the dye-based black matrices have the requisite resistivity to provide improved avoidance of crosstalk from electrical coupling between ITO electrodes and signal lines, the substitution of sufficient dye mixtures for a portion of the pigment-dispersed material needed to raise its resistivity beyond $10^5$ ohm/square would be expected to weaken the O.D. to below 2.0 unless a film thickness greater than 2.0 microns was applied to the pixels and substrate. Only Carbon Black (Pigment Black 7) with its low resistivity of $90 \times 10^2$ ohm/square comes close to O.D. 2.0 at 1.5 micron thickness.

It would therefore be highly unexpected that any combination of dye-based and pigment-based organic black matrices, other than Carbon Black, would provide improved O.D. of over 2.0, without requiring a film thicker than 2.0 microns and Carbon Black is too conductive for effective STN and TFT application. The vast difference in resistivity of carbon black pigment versus various organic dyes would lead one to believe that any appreciable amount of such pigment added to the dyes in order to effectively increase O.D. beyond 2.0 would be significantly detrimental to the resistivity per unit volume of the final material. Yet other pigments have had too low an O.D. to even be considered for ultra thin black matrices.

It is an object of the present invention to provide a stable organic black matrix having O.D. greater than 2.0, at thicknesses less than 1 micron but surface resistivity greater than $10^5$ ohm/square.

SUMMARY OF THE INVENTION

The present invention fulfills the above-stated objective and others by a synergistic composition of polyimide-dye-pigment. The black matrix of this invention has high resistivity and an O.D. greater than 2.0 at a film thickness of 1 micron or less.

The material patterns on various display applications have excellent evenness, high strength, superior environmental safety, high stability, good shelf-life and a low cost of production.

DETAILED DESCRIPTION OF THE PREFERRED EMBODIMENTS

The present invention fulfills the above-stated objective and others by a synergistic composition of polyimide-dye-pigment black matrix mixtures. Such black matrix compositions preferably comprise, by weight, 4% to 8% polyimide binder, 9% to 13% colorant (dye plus pigment), 80% to 85% solvent and 0.3% to 0.8% dispersant. The weight/weight ratio of dye: pigment will range from about 1:15 to about 3:15, preferably 2:15. Surprisingly, the combined O.D. of organic dyes plus non-carbon black pigments is greater than the sum of their parts at less than 1.0 micron (hereinafter referred to as ultra thin) film thickness.

POLYIMIDE/DYE

The polymer vehicles, for the black matrix compositions of the present invention, will typically include polyimide precursors which react in situ to form polyimide resins. Preferably, the precursors will consist of a polyamic acid prepared by reacting oxydianiline (ODA) with pyromellitic dianhydride (PMDA) or by reacting ODA with PMDA and/or benzophenone tetracarboxylic dianhydride (BTDA). These components are typically employed in approximate stoichiometric amounts. Other suitable polyamic acids and polyamic precursors typically employed for the polyimide vehicles of this invention are conventional components as, for example, those listed in Table 1 below. Note that it is possible to include water soluble polymers such as polyvinyl/pyrrolidone and other conventional resins such as novolac in admixture with these precursor components without departing from the Applicants' definition of polyimide precursors.

TABLE 1

| Diamines | Dianhydrides |
|---|---|
| p-Phenylenediamine | 3,3',4,4'-Benzophenone tetracarboxylic dianhydride |
| m-phenylenediamine | |
| 3,3'-dimethoxy-4,4'-diaminobiphenyl | Pyromellitic dianhydride |
| 1,4-bis(4-aminophenoxy)benzene | 3,3'4,4'-Biphenyl tetracarboxylic dianhydride |
| 4,4'-Bis(4-aminophenoxy)-biphenyl | 4,4'-Oxydiphthalic anhydride |
| Bis-4(-[4-aminophenoxy]phenyl)ether | 3,3',4,4'-Diphenylsulfone tetracarboxylic-dianhydride |
| 4,4'-Oxydianiline | 1,2,3,4-cyclobutane tetracarboxylic-dianhydride |
| 4,4'-Diaminodiphenyl sulfone | |
| 2,2-Bis(4-[4-aminophenoxy]phenyl) sulfone | 4,4'-(hexafluoroisopropylidene) diphthalic anhydride |

The dye components of the present invention are soluble organic dye combinations which can effectively absorb light over the broad spectrum of infrared to ultraviolet. It is critical that the dyes be soluble in solvents which dissolve the polyimide vehicle (which solvents will be discussed later). In a particularly preferred embodiment of the present invention, a weight/weight ratio of from about 1:3 to 1:5 of Orasol brown 6RL (Solvent brown 44) to Orasol blue GN (Solvent blue 67) provides a surprisingly effective component for this invention. Such a mixture is commercially available under the trade name DARC-100 sold by Brewer Science, Inc.

Other combinations of Blue, Red, Orange, etc., dyes capable of producing high resistivity black coatings in U.S. Pat. No. 4,822,718 may be employed.

In a preferred embodiment of the present invention, all of the dye component together with a substantial amount of the polyimide component (at least 50%) may be provided in accordance with the black coating compositions disclosed in U.S. Pat. No. 4,822,718, which patent is herein incorporated-by-reference to this disclosure.

Highly preferable dyes for the present invention may also include dyes specified from the color index of Solvent Black 3 to Solvent Black 47, more particularly Solvent Black 35 (Zapon Black X50, BASF), Solvent Black 27 (Zapon Black X51, BASF), Solvent Black 3 (Neptun Black X60, BASF), Solvent Black 5 (Flexo Black X12, BASF), Solvent Black 7 (Neptun Black NB X14, BASF), Solvent Black 46 (Neptun A Black X17, BASF), Solvent Black 47 (Neopin Black X58, BASF), Solvent Black 28 (Orasol Black CN, Ciba-Geigy), Solvent Black 29 (Orasol Black RL, Ciba-Geigy), and Solvent Black 45 (Savinyl Black RLS, Sandoz Corp).

PIGMENT-DISPERSIONS

One surprising aspect of the present invention is the ability to obtain optical density>2.0 at ultra thin film thicknesses without having to resort to the use of Carbon Black.

Although the pigments employed in this invention are indeed macroscopic particles having high surface area and a strong tendency to flocculate which can create haze and light scattering aggregates or variations in rheology, when the pigments of this invention are suitably dispersed and admixed with the polyimide/dye solutions, excellent evenness is achieved.

The pigments of this invention are mixtures of inorganic metal oxides or mixtures of multiple metal oxides selected from metal oxides of copper, manganese, chromium, iron, magnesium, aluminum, tin, zinc, titanium, nickel, cobalt and mixtures thereof. These metal oxides are preferred for purposes of forming the so-called spinel structure. They unexpectedly provide a synergy that together with dyes of this invention will achieve O.D. >2.0 at ultra thin film thicknesses, while their combined surface resistivity is magnitudes above the $10^5$ ohm/square threshold required for effective STN and TFT application.

Suitable pigments may include pigments specified from color index 77248 to 77494, including pigment Black 22 (color index (C.I.) 77429), such as Fast Black 100 sold by Bayer Corp.; Pigment Black 26 (C.I. 77494) such as Daipyroxide TM Black 3550 and 3551 sold by Dainichiseika Color & Chemical Manufacturing Co., Ltd. of Japan; Pigment Black 27 (C.I. 77502); Pigment Black 28 (C.I. 77428) sold as Harshaw 9875 M Plus by Engelhard Corporation; and also mixtures of Pigment Green 50 (C.I. 77377) with Pigment Blue (C.I. 77346), and Pigment Red (C.I. 77491). It is particularly preferred to use Pigment Black 26 (C.I. 77494) composed of mixed metal oxide of copper, manganese and iron.

It is preferred in manufacturing the pigment dispersions of this invention to employ as the primary particle size of the pigments less than 100 nanometers (nm), particularly less than 50 nm. The particles of these pigments may also be coated with inorganic layers of silica, alumina, or zirconia for purposes of improving the stability of the dispersions.

Dispersants, effective for a Newtonian dispersion of the pigment in the polyimide vehicle and solvent system, were desired. Cationic dispersants are preferred, particularly cationic dispersants composed of solutions with high molecular weight blocked copolymers with chemical groups having strong affinity to the pigments of this invention. One such particularly preferred dispersant is that sold under the trademark Disperbyk-163 by Byk-Chemie. Other such cationics include, for example, the trade names Disperbyk-160, 161, 162, 164 and 166. Anionic and nonionic dispersants are also suitable. A list of such dispersants may be seen in Table 2 below.

TABLE 2

| Dispersing Agent | Company | Ionic Nature |
|---|---|---|
| Disperbyk-160 | Byk-Chemie | Cationic |
| Disperbyk-161 | Byk-Chemie | Cationic |
| Disperbyk-162 | Byk-Chemie | Cationic |
| Disperbyk-163 | Byk-Chemie | Cationic |
| Disperbyk-164 | Byk-Chemie | Cationic |
| Disperbyk-166 | Byk-Chemie | Cationic |
| Lactimon | Byk-Chemie | Anionic |
| Bykumen | Byk-Chemie | Anionic |
| Dumasperse 535 | Hickson | Anionic |
| Dumasperse 540 | Hickson | Anionic |
| Dumasperse 545 | Hickson | Anionic |
| Mazsperse 85B | PPG | Nonionic |
| Mazsperse SF 19 | PPG | Nonionic |
| Nuosperse 657 | Huls | Nonionic |
| Nuosperse 700 | Hul | Anionic |
| Solsperse 12000 | Zeneca | Anionic |
| Solsperse 27000 | Zeneca | Nonionic |

The dispersion is carried out in, for example, Eiger Mini-100 motormills using suitable beads, e.g., 0.65 mm yttrium stabilized zirconium oxide beads.

Preferably, the pigments are dispersed in a Newtonian dispersion having dispersant in an amount comprising 5% the weight of the pigment, a solution of polyimide precursor (22.7% solids in solution) and a substantial amount of solvent.

SOLVENTS

A solvent effective for solubilizing the polyimide vehicle and dye compound is selected. The most preferred solvents for the polyimide/dye component and for the pigment dispersion are N-methyl-2- pyrrolidone (NMP) and cyclohexanone. Other suitable solvents may include dimethylacetamide (DMAc), N,N-dimethylformamide (DMF), bis-2-methylethyl ether (diglyme), tetrahydrofurfuryl alcohol (THFA), dimethylsulfoxide (DMSO), xylenes, cyclic ketones, alcohols, esters, ethers and mixtures thereof. A polymer/dye solution of such dyes shall also be suitable for the effective pigment dispersion, previously discussed.

The black matrix compositions of this invention (1) can be applied to substrates by spin coating, (2) can be imaged using the same process employed to image the RGB pixels, (3) developed using the same development process as the pixels, and (4) provide an average O.D. for 1 micron film thicknesses over the region 400–700 nm of 2.4 O.D. The shelf life is excellent, i.e., three months in the freezer or three weeks at room temperature. The surface resistivity is very high. i.e.. in the range of $10^{11}$ ohm/square, and cost of production is much lower than sputtered chrome black matrices.

EXAMPLE 1

In a plastic beaker is added 11.6 g of N-methylpyrrolidone (NMP). 82 g of cyclohexanone. 1.5 g of disperbyk-163. 20 g of DARC polymer and 30 g of Pigment Black 26. The mixture is stirred with a spatula for about 5 minutes till homogeneous. This pigment slurry is then added to Eiger M-100 mill at 1000 rpm over a period of 15 minutes. using 0.65 mm yttrium stabilized zirconium oxide beads. The beaker is then rinsed with 20 g of cyclohexanone and rinse added to the mill. The grind speed is slowly increased to 3000 rpm. The pigment is ground at this speed for 2 hours. In a separate plastic beaker equipped with mechanical stirrer is added 32.4 g of DARC polymer (22.9% in NMP only) and 60 g of DARC 100. The mixture is stirred for 10 minutes. After 2 hours, the mixture of DARC polymer and DARC 100 is added to the mill at 1000 rpm. DARC polymer is synthesized by dissolving 48.1 g of oxydianiline in NMP, then added 51.8 g of pyromellitic dianhydride and reacted for 5 hours at 40° C. The beaker is rinsed with 50 g of N-methyl-pyrrolidone and the rinse is added to the mill at 1000 rpm. The mill is then run at 3000 rpm for 90 minutes. Formulation is then filtered through 0.2 µm filters. The formulation is summarized in Table 3. A resistivity of $5.6 \times 10^{11}$ ohm/square, at a thickness of 1 micron and an O.D. of 2.4 were measured.

TABLE 3

| Chemical Constituent | Weight in grams |
| --- | --- |
| N-methyl-pyrrolidone | 61.6 g |
| Cyclohexanone | 102 g |
| Disperbyk-163 | 1.5 g (5% of the weight of pigment) |
| DARC polymer | 52.4 g (22.9% in NMP only) |
| Pigment Black 26 | 30 g |
| DARC 100 | 60 g |

Table 4 illustrates preferred composition with reference to Weight % for 2.4 optical density and $10^{11}$ ohm/square surface resistivity, at 1 micron film thickness.

TABLE 4

| Chemical Composition | Weight % | Best Mode |
| --- | --- | --- |
| Polyamic acid | 4%–8% | 5.7% |
| Colorant (dye + pigment) | 9%–13% | 11.5% |
| Dispersant | 0.3%–0.8% | 0.8% |
| Solvent | 80%–85% | 82.0% |

EXAMPLE 2

In a plastic beaker is added 375 g of NMP, 375 g of cyclohexanone and 250 g of Pigment Black 26 (Daipyroxide TM Black 3551) with the primary particle size ranging from 10 to 20 nm and the surface of which is covered with thin silica layers. The mixture is stirred with a spatula for 5 minutes till homogeneous. This pigment slurry is then added to a ball mill together with quartz beads with 5 mm diameter of particle size, and ground at the speed of 100–200 rpm for 2 weeks. This mixture is dispersed at the speed of 7.000 rpm for 5 minutes in a homogenizer (Nihon Seiki Kaisha Ltd.) by adding 47.8 g of NMP and 21.0 g of cyclohexanone to it. In a separate glass beaker equipped with a mechanical stirrer is added 67.4 g of DARC polymer (20 wt % in NMP only), 54.8 g of DARC 100, 69.8 g of NMP and 33.5 g of cyclohexanone. The mixture is dispersed in a homogenizer at the speed of 7.000 rpm for 5 minutes. In a homogenizer is added 225.3 g of the polymer/dye mixture and 175.7 g of the black pigment slurry. The homogenizer is then run at 10.000 rpm for 10 minutes. Formulation is then filtered through 0.2 µm filters. The formulation is summarized in Table 5.

TABLE 5

| Chemical Composition | Weight % |
| --- | --- |
| Polyamic acid | 4%–8% |
| Colorant | 6%–10% |
| Dispersant | 0.1%–0.4% |
| Solvent | 85%–90% |

(O.D. = 2.0 at 1 micron film thickness and surface resistivity of $3.3 \times 10^{11}$ ohm/square)

Method of Use (Application)

Photolithography process is applied to get fine resolution and wide β-bake window. Prime substrate is cleaned. APX-K1, adhesion promoter from Shipley, is coated on substrate at 3000 rpm for 30 seconds, baked on hot plate at 175° C. for 30 seconds. Black matrix formulation is coated on APX-K1 coated substrate at 750 rpm for 90 seconds, α-baked to evaporate solvent on hot plate at 100° C. for 60 seconds. The coatings were then β-baked in conventional ovens at 120°–180° C. for 30 minutes. The polyamic acids is 30%–50% imidized in this process. Photoresist is coated at 5000 rpm for 30 seconds, soft baked on a hot plate at 100° C. for 30 seconds, exposed and developed. Photoresist is stripped in safestrip. Black matrix is then final cured in oven bake at 250° C. for 30 minutes which completes the imidization process. Other colors are applied and processed.

Characteristic Properties

Figure 1:
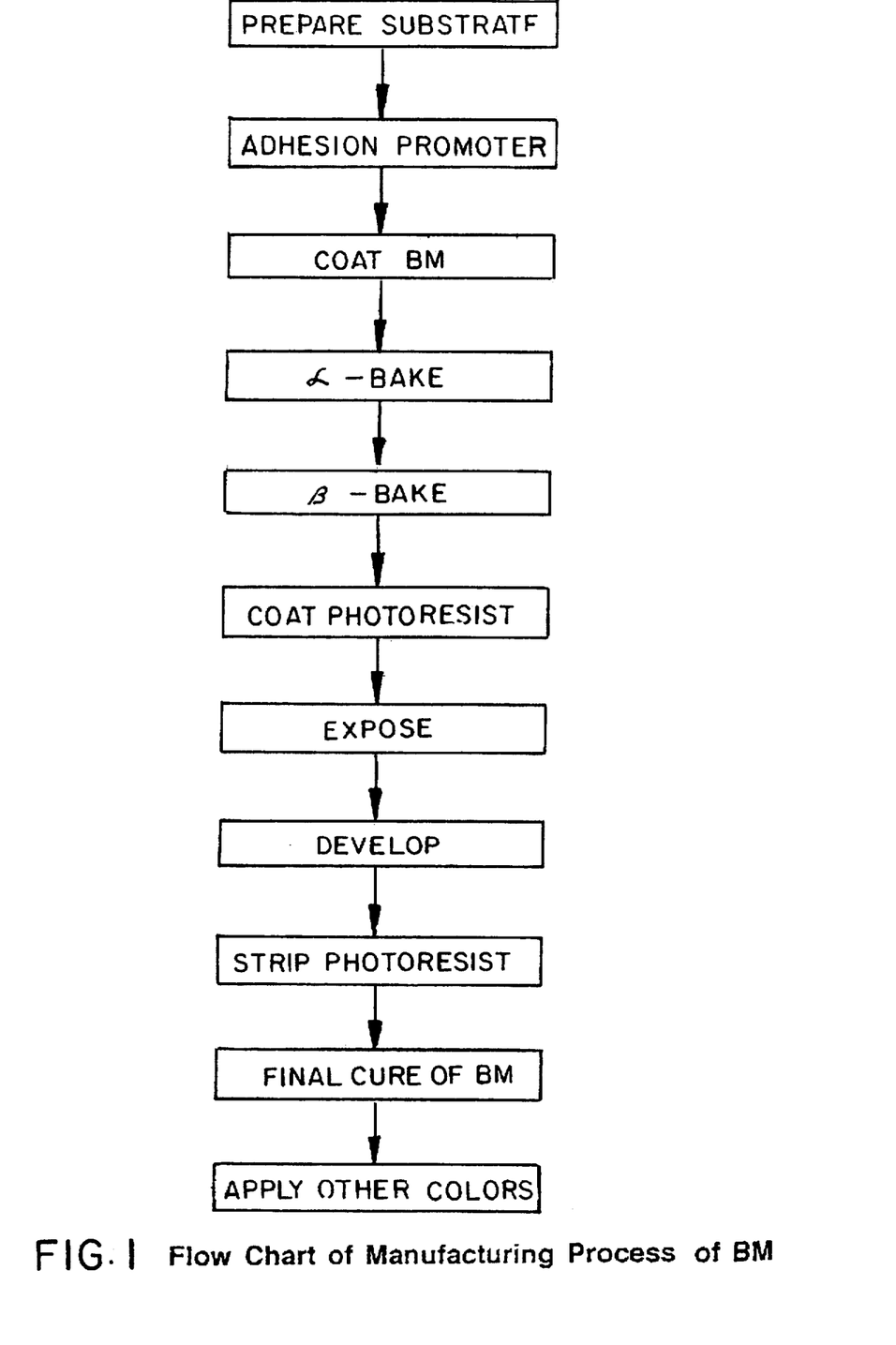
FIG. 1 is a flow chart explaining the manufacturing process of a black matrix according to the present invention.
Figure 2:
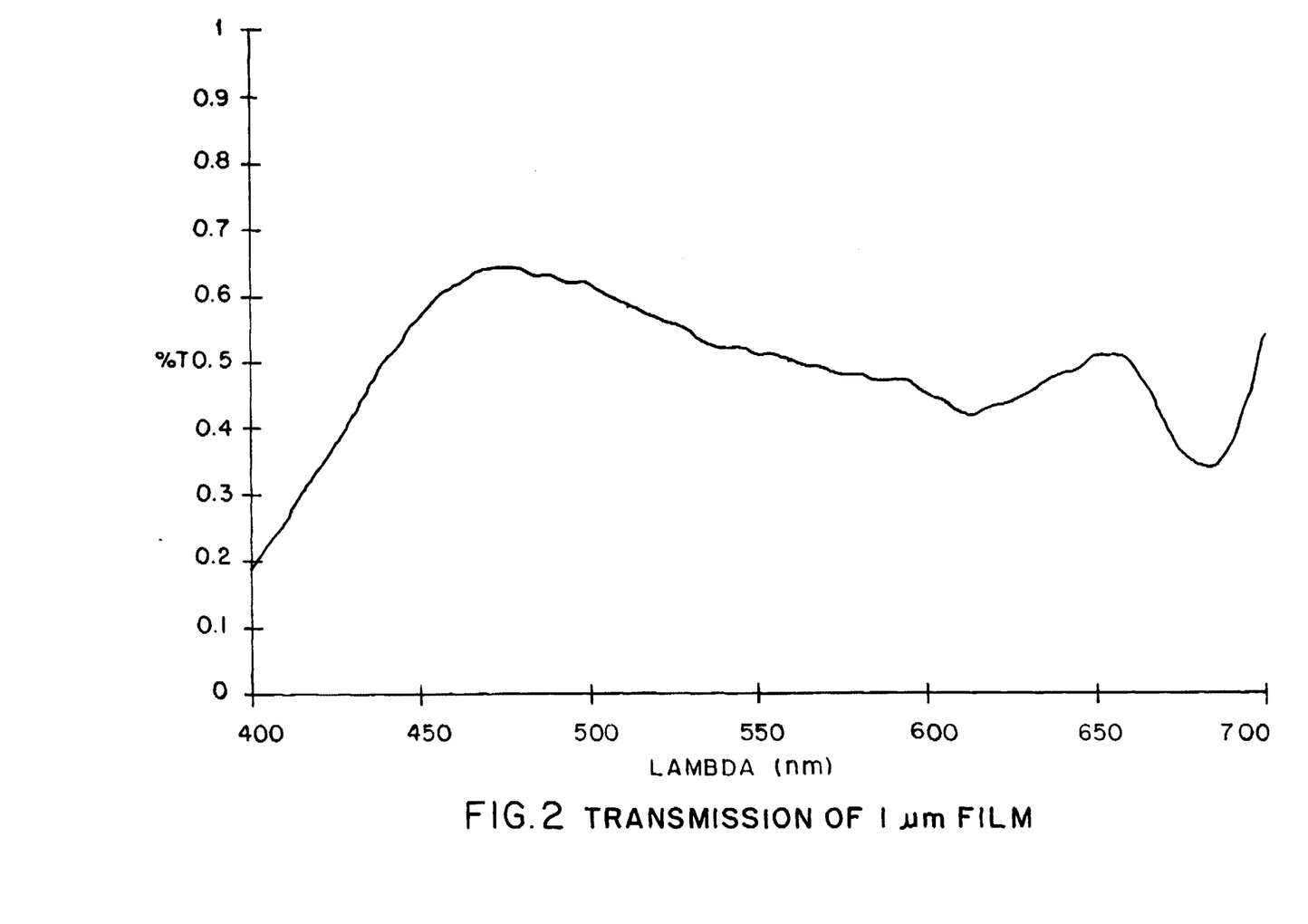
FIG. 2 is a graph showing transmission spectra of 1 μm cured film obtained in Example 1.
Figure 3:
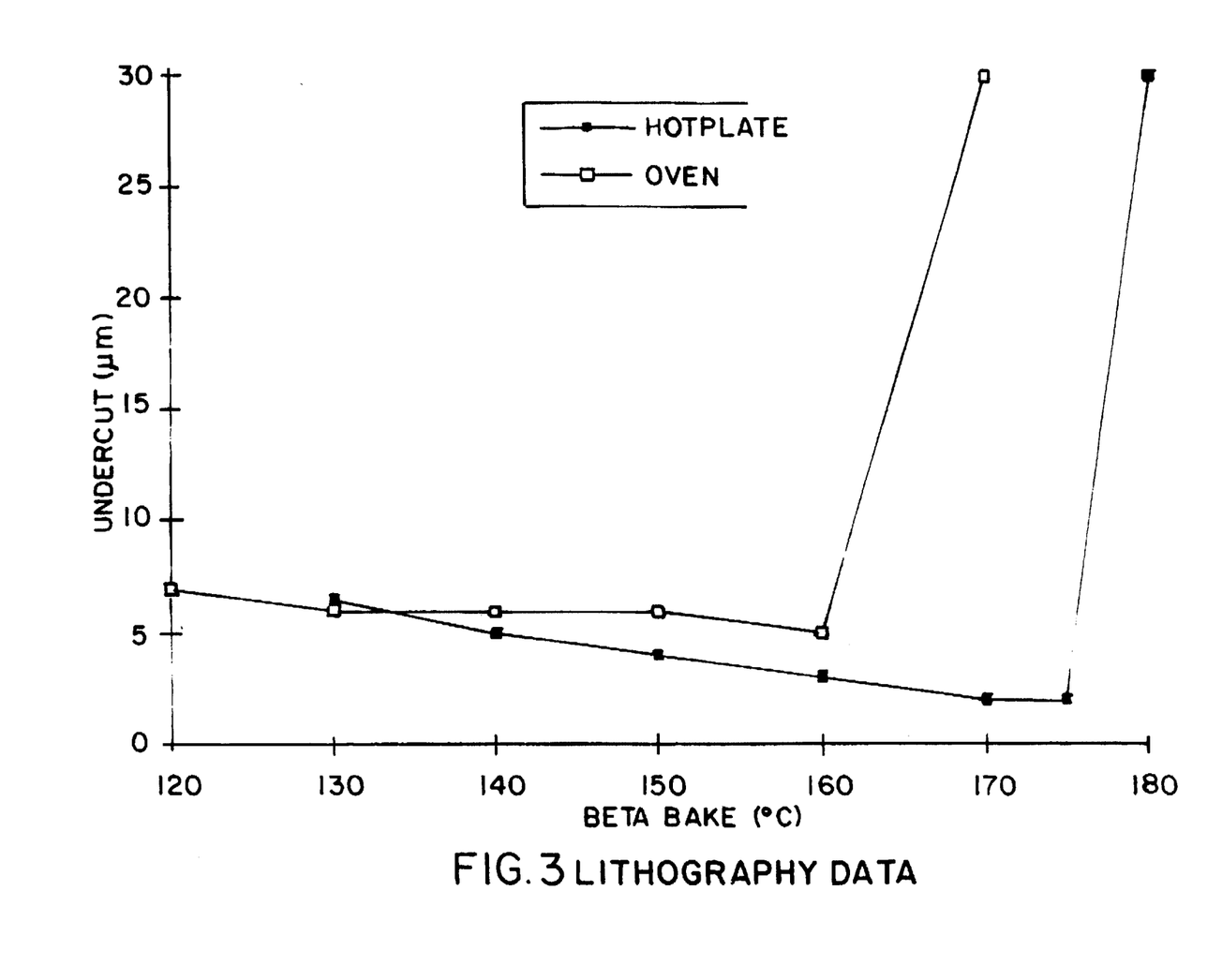
FIG. 3 shows sets of lithography data using both convection oven and hot plate beta-bake processes.
Figure 4:
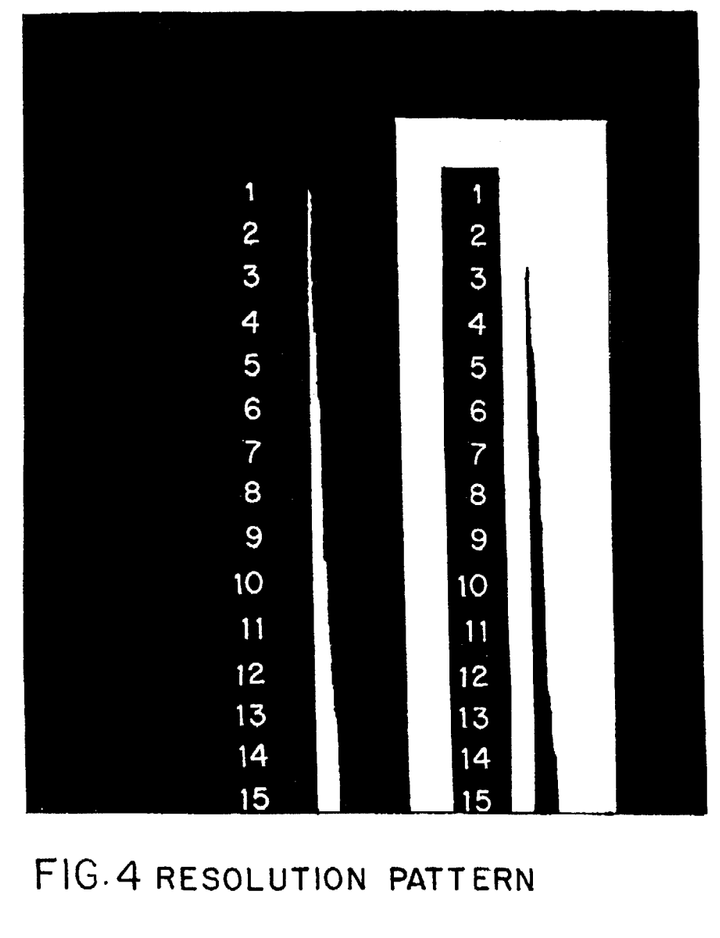
FIG. 4 is a schematic diagram illustrating photo of a resolution dagger.
Figure 5:
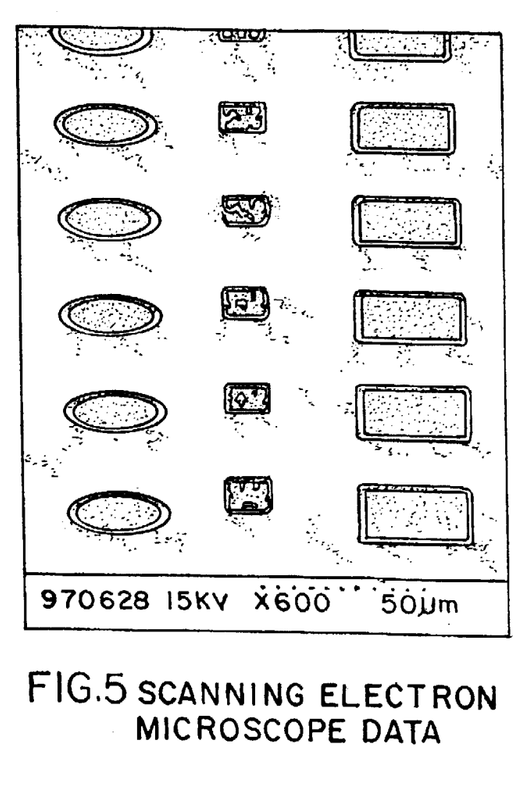
FIG. 5 demonstrates Scanning Electron Microscope (SEM) of the black matrix material after resist removal and final cure.
Figure 6:
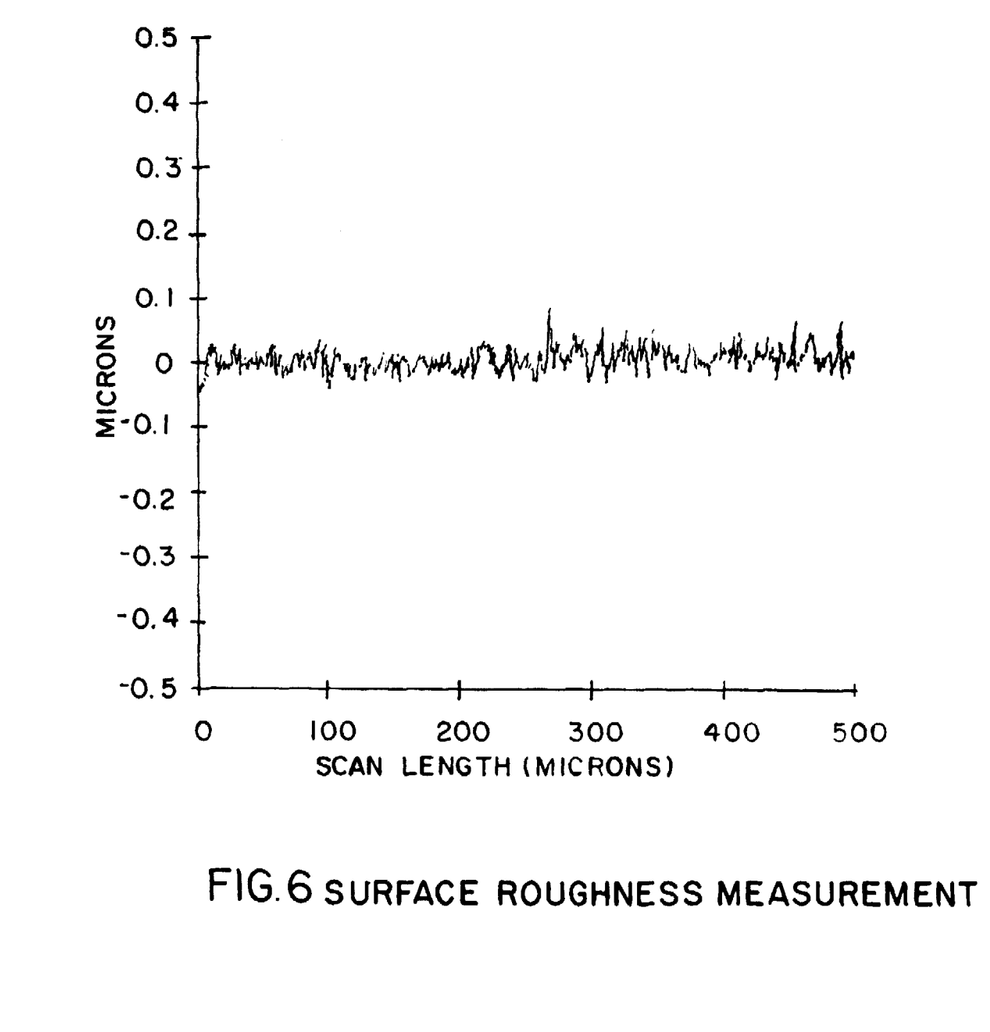
FIG. 6 is a schematic diagram illustrating typical surface roughness measurement of the cured film.
Figures 7, 7A, 7B, 7C:
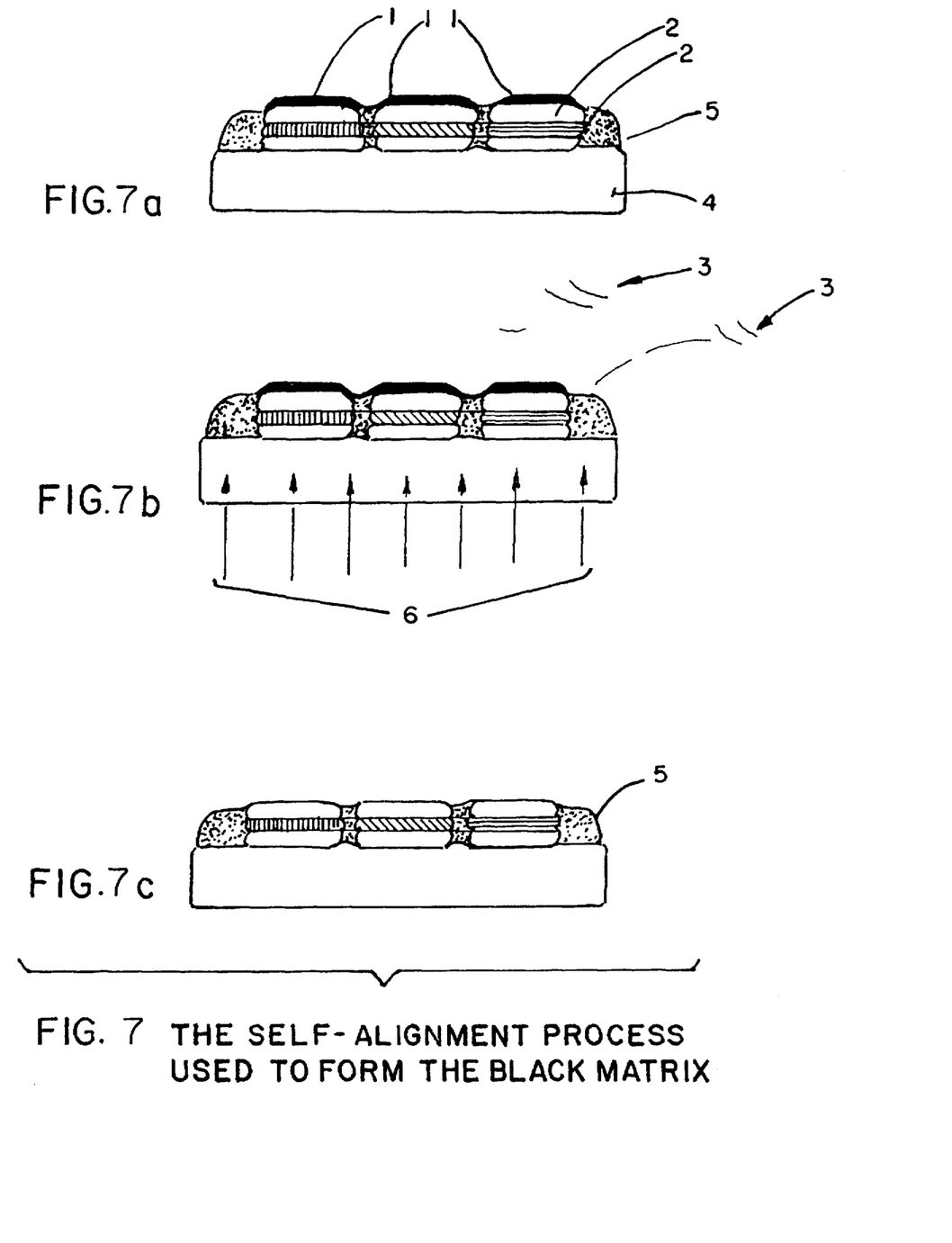
FIGS. 7, 7(a), 7(b), and 7(c) illustrate coating and imaging organic black matrices photoresist onto generally STN or TFT color pixels for large area LCDs.

FIG. 1 is a flow chart explaining the manufacturing process of a black matrix according to the present invention. FIG. 2 is a graph showing transmission spectra of 1 µm film obtained in Example 1. The material meets the goals of optical density and high resistivity. FIG. 3 shows sets of lithography data using both convection oven and hot plate beta-bake processes. Lithography results show a wide processing latitude. Resolution down to 3 µm at 1 µm film thickness are achievable within a wide range of intermediate (beta-bake) temperatures. FIG. 4 is a schematic diagram illustrating photo of a resolution dagger. FIG. 5 demonstrates Scanning Electron Microscope (SEM) of the black matrix material after resist removal and final cure. Good sidewall definition is evident in the pixel patterns. FIG. 6 is a schematic diagram illustrating typical surface roughness measurement of the cured film. Surface roughness measurements were taken on a lithography test sample in an area adjacent to a resolution dagger. The surface has a uniform microroughness that is well suited to a black matrix application. Resistivity measurements for a 1 µm film are on the order of $10^{11}$ Ω/square, thus providing a good balance of optical density and electrical properties. The composition can be applied by spin coating, imaged and developed using the same process used for RGB pixels. The average optical density for the 1 µm film thickness over the region 400–700 nm is 2.4. The material has good shelf life (3 months in freezer, 3 weeks at room temperature). It has low cost compared to chrome black matrix.

What is claimed:

1. A photolithographically imageable black matrix coating material having optical density ≥2.0 and surface resistivity greater than $10^5$ ohm/square when coated at thicknesses ≤1.0 micron, consisting essentially of
   a. a polyimide precursor vehicle and a solvent system therefore,
   b. a soluble light-absorbing dye or mixtures of dyes, said dye or mixtures of dyes being substantially completely soluble in the vehicle and solvent system, and being effective to absorb substantially all light across a broad spectrum of from ultra violet to infrared, and
   c. a mixed metal oxide non-carbon black pigment or mixture of pigments, and a dispersant therefor in Newtonian dispersion, said pigment or mixtures of pigments being substantially black in color.

2. The black matrix coating material of claim 1, wherein the polyimide vehicle solvent system is an effective mixture of NMP and cyclohexanone, the dye mixture is solvent brown 44 and solvent blue 67 at a weight/weight ratio of 1:3 to 1:5 and the pigment is a spinel structured oxide of metals and mixtures of multiple metals selected from the group consisting of copper, manganese, chromium, iron, magnesium, aluminum, zinc, tin, titanium, nickel, cobalt.

3. The black matrix coating material of claim 2 having a weight per cent composition of 4% to 8% polyimide vehicle, 80% to 85% solvent, 9% to 13% dye plus pigment wherein the weight/weight ratio of dye to pigment is 1:15 to 3:15, and the pigment is pigment black 26 made from a spinel structured oxide of metals and mixtures of multiple metals selected from copper, manganese and iron, having a C.I. of 77494, and 0.3% to 0.8% of a cationic dispersant made from high molecular weight blocked copolymers with chemical groups having strong affinity to the pigment black 26.

4. The coating material of claim 3 having a resistivity of at least $10^{11}$ ohm/square.

5. The black matrix coating material of claim 1 having a dye specified from color index of solvent black 3 to solvent black 47.

6. The coating material of claim 1 having a pigment specified from C.I. 77428 to 77494.

7. The coating material of claim 1 wherein the polyimide vehicle is selected from the group of reaction products of
   a. ODA and PMDA, and
   b. ODA and BTDA.

8. The coating material of claim 1 wherein the pigment dispersion comprises pigment particles having a particle size less than 100 nm.

9. The coating material of claim 1 wherein the surface of the pigments is coated with a material selected from the group consisting of silica, alumina and zirconia.

10. A method for making an organic black matrix coating material for STN or TFT pixel applications, said method comprising admixing
    a. a polyimide precursor vehicle and light-absorbent organic broad spectrum light-absorbing dye capable of forming a high resistivity black coating and an effective solvent, and
    b. a Newtonian dispersion of a black pigment having a C.I. from 77428 to 77494 at particle sizes less than 100 nm, and composed of mixed metal oxides of copper, manganese and iron, with an effective dispersant in the said effective solvent, and said dye and pigment being in a weight/weight ratio of about 1:15 to 3:15,
    whereby the coating materials optical density is higher than 2.0 at ultra thin coating thicknesses without the need for admixing carbon black.

* * * * *